US009966380B1

(12) United States Patent
Bo et al.

(10) Patent No.: US 9,966,380 B1
(45) Date of Patent: May 8, 2018

(54) SELECT GATE SELF-ALIGNED PATTERNING IN SPLIT-GATE FLASH MEMORY CELL

(71) Applicant: Texas Instruments Incorporated, Dallas, TX (US)

(72) Inventors: Xiangzheng Bo, Plano, TX (US); Douglas Tad Grider, III, McKinney, TX (US); John MacPeak, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/375,952

(22) Filed: Dec. 12, 2016

(51) Int. Cl.
| | |
|---|---|
| *H01L 29/788* | (2006.01) |
| *H01L 27/11521* | (2017.01) |
| *H01L 29/423* | (2006.01) |
| *H01L 27/11529* | (2017.01) |
| *G11C 16/04* | (2006.01) |

(52) U.S. Cl.
CPC .... *H01L 27/11521* (2013.01); *G11C 16/0425* (2013.01); *H01L 27/11529* (2013.01); *H01L 29/42328* (2013.01)

(58) Field of Classification Search
CPC ......... H01L 27/11529; H01L 29/42328; H01L 27/115; H01L 27/11521; H01L 21/28518; H01L 22/20; H01L 29/45; H01L 29/495; H01L 29/4916; H01L 29/4966; H01L 29/7883; H01L 29/521; H01L 27/11568; H01L 29/66825

USPC ........ 257/315, 316, 319, 321; 438/257, 267, 438/279, 286, 526
See application file for complete search history.

(56) References Cited

U.S. PATENT DOCUMENTS

| | | | | |
|---|---|---|---|---|
| 5,656,840 | A * | 8/1997 | Yang ................. | H01L 27/11521 257/316 |
| 6,436,764 | B1 | 8/2002 | Hsieh | |
| 6,583,009 | B1 | 6/2003 | Hui et al. | |
| 2006/0071265 | A1* | 4/2006 | Koh .................... | G11C 16/0433 257/315 |
| 2008/0043532 | A1* | 2/2008 | Hara ...................... | G11C 16/10 365/185.12 |
| 2008/0112231 | A1* | 5/2008 | Shum ................. | G11C 16/3418 365/185.27 |
| 2010/0155805 | A1* | 6/2010 | Ozawa .............. | H01L 21/28273 257/315 |
| 2011/0049603 | A1* | 3/2011 | Pan .................... | H01L 21/28273 257/316 |

* cited by examiner

*Primary Examiner* — Shahed Ahmed
(74) *Attorney, Agent, or Firm* — Kenneth Liu; Charles A. Brill; Frank D. Cimino (57) ABSTRACT

A split-gate flash memory cell (cell) that can be formed by a method including self-aligned patterning for the select gates includes a semiconductor surface. A first control gate (CG) on a first floating gate (FG) and a second CG on a second FG are on the semiconductor surface. A common source/drain is between the first and second FG. A first select gate and a second select gate are on a select gate dielectric layer that is between a first BL source/drain in the semiconductor surface and the first FG and between a second BL source/drain and the second FG, respectively. The first select gate and the second select gate are spacer-shaped.

20 Claims, 9 Drawing Sheets

SELECT GATE SELF-ALIGNED PATTERNING IN SPLIT-GATE FLASH MEMORY CELL

FIELD

Disclosed embodiments relate to split-gate flash memory cells.

BACKGROUND

Flash memory is an improved version of electrically erasable, programmable read-only memory (EEPROM) which is capable of block-by-block erasing. Flash memory is used in a variety of applications that require programmability with no loss of memory data during power down (non-volatility).

A particular flash memory cell is known in the art as a split-gate flash cell that comprises 2 side-by-side transistor structures that share a common source (or drain) region that is in the middle of the flash memory cell. In a split-gate flash cell, the select gate is formed to both couple voltage onto the floating gate (FG) and to control a channel region of the transistor. To accomplish these purposes, the select gate is physically formed directly overlying the substrate and overlying, or next to, the FG. Split-gate flash cells are widely used in semiconductor industry due to its advantage (over convention flash cells) of lower leakage by being controlled by side gate transistors, lower program current, higher endurance and improved data retention.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize for split-gate flash cells that the erased bit reading current ($Ir_1$) depends on the select gate (or side gate, or word line (WL)) device's channel length. In a known integration process, the respective select gate electrodes are aligned to an active moat (the active area edge) or to an edge of the control gate (CG). Due to photolithography misalignment in these select gate formation processes there is a resulting critical dimension (CD) difference between even and odd select gates, causing an $Ir_1$ difference between even and odd bitlines (BL) in each flash cell. Cell-to-cell select gate CD variation resulting from other process variations result in threshold voltage (Vt) differences, which may make the even-odd $Ir_1$ variation even worse. Even-odd BL $Ir_1$ variation across the flash cells on a die is a problem as it reduces the flash bitcell read margin.

Disclosed embodiments include split-gate flash memory cells (split-gate flash cells) that comprise a substrate having a semiconductor surface, a first gate stack comprising a first CG on a first FG and a second gate stack comprising a second CG on a second FG each on a floating (or tunnel) gate dielectric layer on the semiconductor surface. A common source or common drain (common source/drain) is in the semiconductor surface between the first FG and second FG. A first select gate and a second select gate are on a select gate dielectric layer between a first BL source/drain in the semiconductor surface and first FG and between a second BL source/drain in the semiconductor surface and second FG, respectively. The first select gate and the second select gate are spacer-shaped.

As used herein, "spacer-shaped" refers to a shape having a rectangular bottom with a rounded top corner against the FG-CG stack. In contrast, the shape of conventional select gate is rectangle in both the top and bottom corner. Disclosed split-gate flash memory cells have minimized even-odd BL $Ir_1$, and there is also a minimized even-odd BL $Ir_1$ across the die, and across the fabricated wafer.

BRIEF DESCRIPTION OF THE DRAWINGS

Reference will now be made to the accompanying drawings, which are not necessarily drawn to scale, wherein.

DETAILED DESCRIPTION

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Disclosed embodiments recognize with split-gate flash cells being scaled down in size, the select gate length becomes shorter, and thus more susceptible to process variation, such as to gate length variation between the respective select gates on opposite ends of the flash cell (referred to herein as even/odd select gates, and their length difference as an even/odd select gate CD variation) that influence the select gate Vt. Broadening of the select gate Vt distribution within the die and die-to-die across the substrate (e.g., wafer) undesirably translates into a larger reading current (Ir) distribution within the die and die-to-die across the wafer, as well as reduced flash circuit design margins.

A known solution used in split-gate flash cell integration to reduce even/odd select gate CD variation is to tighten the select gate photo-alignment margin, such as by employing improved lithography apparatus. However, it is recognized that known tightening of the select gate photo alignment margin is limited in effectiveness because the alignment margin cannot be made to be zero so that an even/odd select gate CD difference generally always exists.

Figure 1:
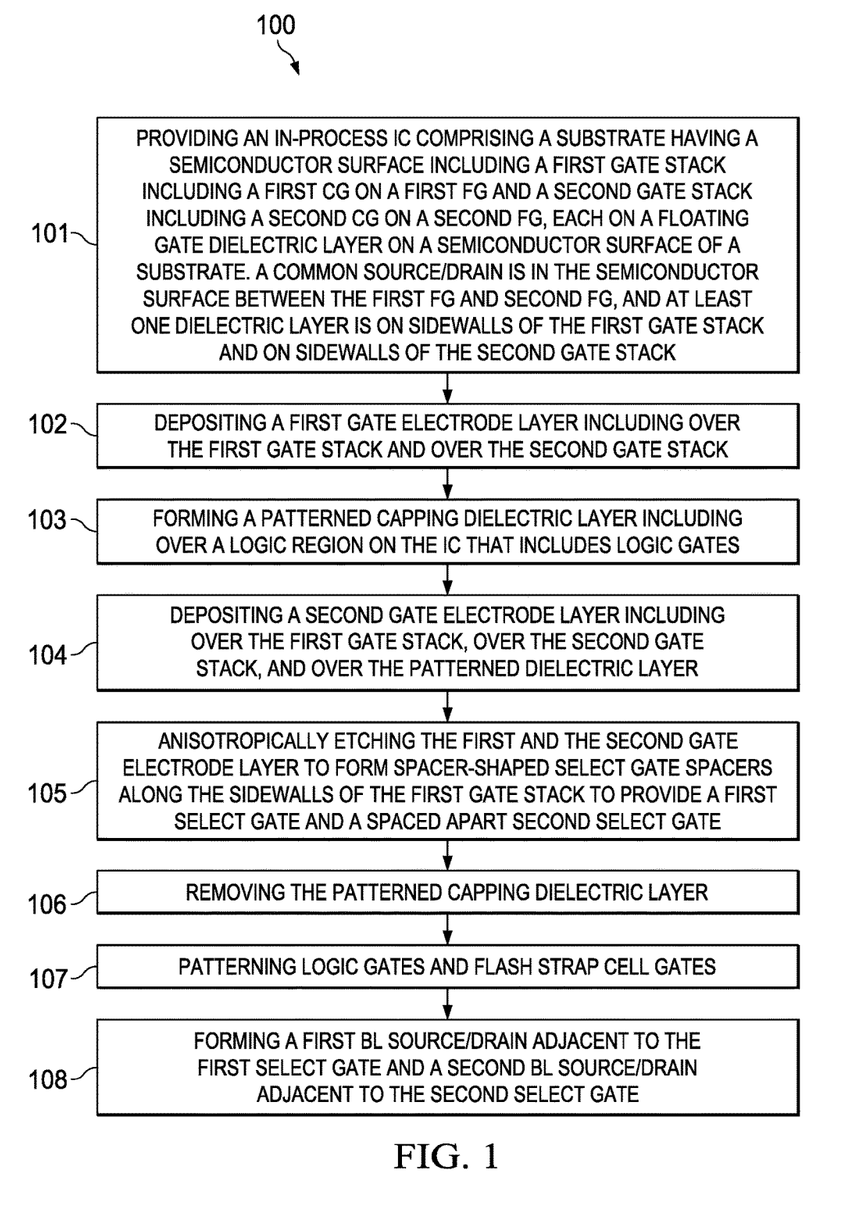
FIG. 1 is a flow chart that shows steps in an example method for fabricating a split-gate flash cell on an integrated circuit (IC) using a self-aligned patterning process to minimize even-odd select gate CD misalignment, according to an example embodiment.

FIG. 1 is a flow chart that shows steps in an example method 100 for fabricating a split-gate flash memory cell that utilizes a self-aligned select gate spacer etch patterning process to minimize even-odd select gate CD misalignment, and thus reduces the $Ir_1$ difference between even and odd BLs, according to an example embodiment. The split-gate flash cell can be based on either n-channel metal-oxide semiconductor (NMOS) or p-channel MOS (PMOS) transistors. Although NMOS transistors may generally be described herein, it should be clear to one having ordinary skill in the art to use this information for PMOS transistors as well, by n-doped regions being substituted by p-doping and vice versa. Disclosed embodiments can be applied to NOR or NAND-based flash memory designs.

Step 101 comprises providing an in-process IC comprising a substrate having a semiconductor surface including a first gate stack including a first CG on a first FG and a second gate stack including a second CG on a second FG, each on a floating gate dielectric layer on a semiconductor surface of a substrate. A common source/drain is in the semiconductor surface between the first FG and second FG, and at least one dielectric layer is on sidewalls of the first gate stack and on sidewalls of the second gate stack.

Figure 2A:
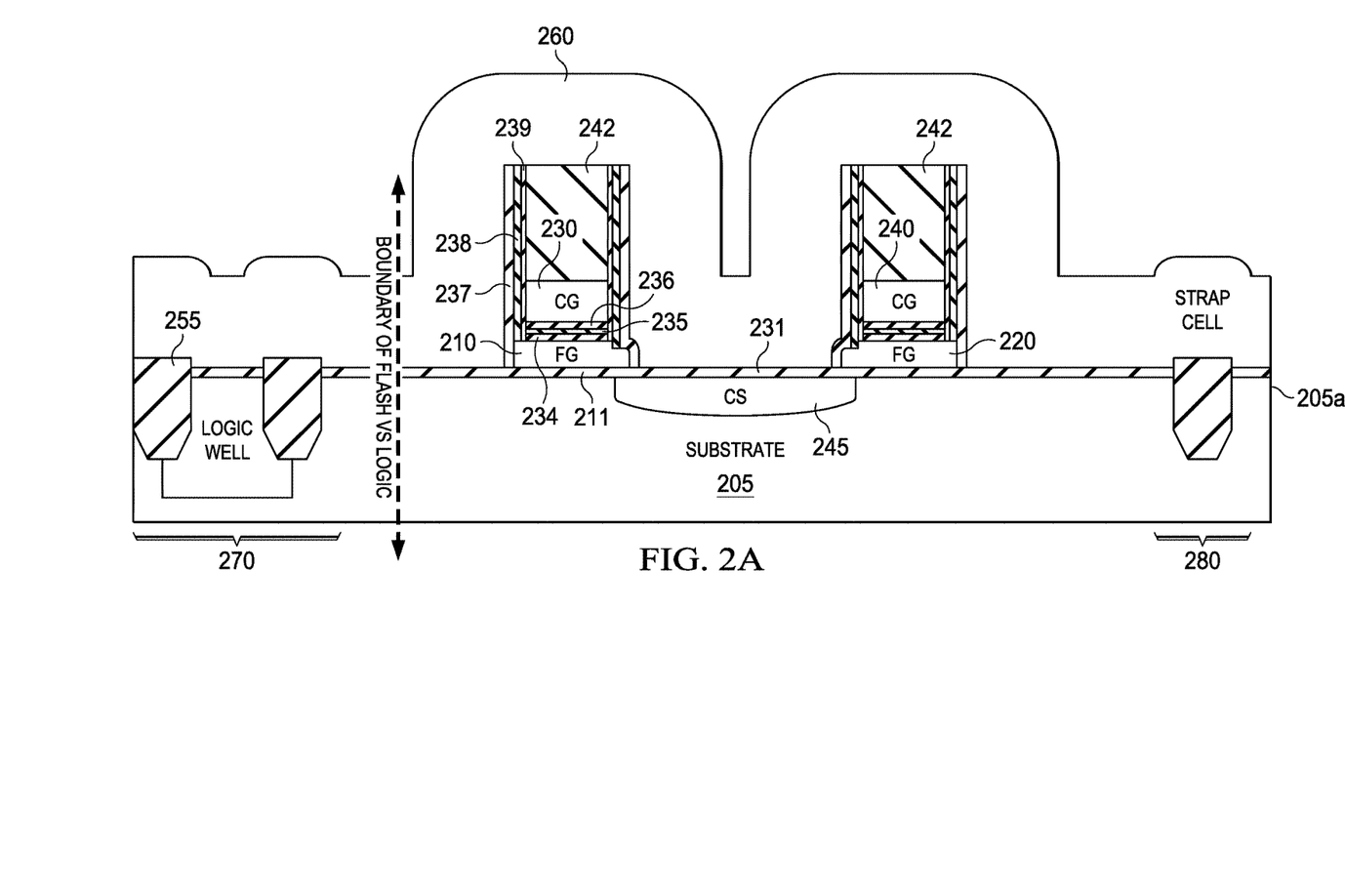
FIGS. 2A-2G shows successive in-process cross sectional depictions corresponding to steps in an example method for forming of split-gate flash memory cells using a self-aligned patterning process to minimize even-odd select gate CD misalignment.

Step 102 comprises depositing a first gate electrode layer including over the first gate stack and over the second gate stack. A typical thickness range for the first gate electrode layer is 800 Å to 1,600 Å. FIG. 2A is a cross sectional depiction of the resulting in-process IC including a split-gate flash cell following the first gate electrode layer deposition (step 102) described as being a polysilicon deposition that forms a polysilicon layer 260 over the gate stacks for what will be defined by later steps in method 100 into select gates. The first gate stack comprises the first CG 230 on the first FG 210 and a second gate stack comprises the second CG 240 on the second FG 220. The first gate electrode layer may also comprise a metal material (e.g., metal or metal alloy) to realize metal gates. For example, Low-Pressure Chemical Vapor Deposition (LPCVD) can be used to deposit the first gate electrode layer. There are dielectric layers on the sidewalls of the gate stacks shown in FIG. 2A including a first dielectric layer 237 (e.g., silicon oxide) on a second dielectric layer 238 (e.g., silicon nitride) on a third dielectric layer 239 (e.g., silicon oxide) that collectively provide electrical isolation for the CG and FG of the gate stacks.

The in-process IC comprises a substrate 205 having a semiconductor surface 205a. The substrate is generally in wafer form having a plurality of die. The substrate 205 can comprise silicon, silicon-germanium, or other semiconductor materials including III-V or II-VI materials, and can comprise a bulk substrate or an epitaxial layer on a bulk substrate. One particular arrangement is a silicon/germanium (SiGe) semiconductor surface on a silicon substrate.

The first FG 210 and second FG 220 are on a floating gate dielectric layer 211 on the semiconductor surface 205a. There is a dielectric stack between the CGs and FGs comprising a first dielectric layer 234, second dielectric layer 235 and a third dielectric layer 236. A common source/drain 245 shown as a common source (CS) is in the semiconductor surface 205a between the first FG 210 and second FG 220 shown having a dielectric layer 231 thereon. Shown on CG 230 and 240 is a silicon nitride layer 242.

On the same IC die is shown a logic region 270 where logic gates are formed and a region 280 where "strap cells" are formed. Dielectric isolation is shown as shallow trench isolation (STI) 255. The logic region 270 showing a logic well where logic gates are formed and the "strap cell" in region 280 are provided to show disclosed processing is for generally forming flash memory devices embedded with logic devices and disclosed processing will not add any new masks, even for flash memory having strap cells. However, disclosed embodiments may also be used for stand-alone split-gate flash cell memory. A flash "strap cell" is used for connections through metal(s) to couple to the CGs 230, 240, CS 245 or select gate transistors, which are generally within a 2D flash array.

The floating gate dielectric layer 211, such as a dielectric oxide (e.g., silicon oxide) layer, may be for example between about 50 Å and 120 Å in thickness. The floating gate dielectric layer 211 is selected to be relatively thin to allow charge transfer to the FGs 210, 220 above during programming or erasing, but thick enough to provide good charge retention during non-programming and non-erasing operation. Because the FGs 210, 220 are electrically isolated by their floating gate dielectric layer 211 from the semiconductor surface 205a, electrons reaching it are trapped until they are removed by another application of electric field (e.g., an applied voltage or ultraviolet (UV) light as in erasable programmable read-only memory (EPROM)).

Figure 2B:
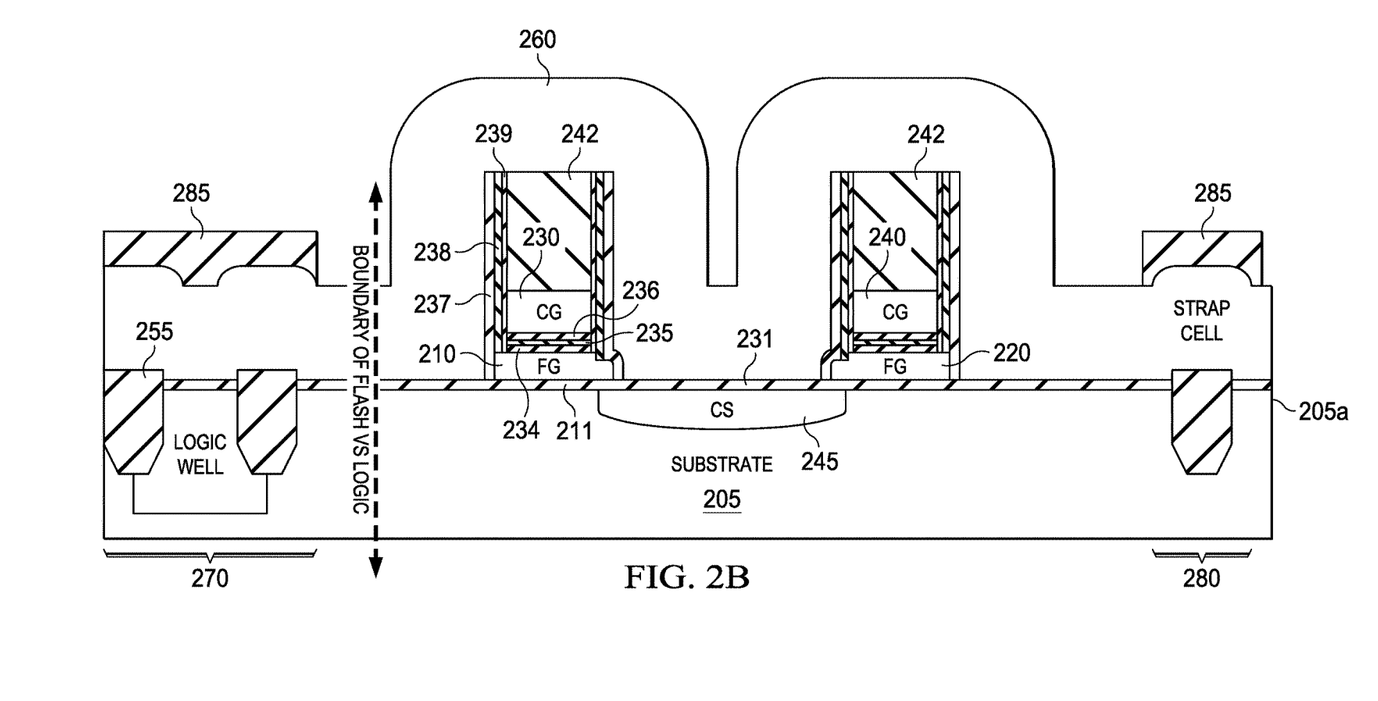

Step 103 comprises forming a patterned capping dielectric layer including over a logic region 270 on the IC that includes logic gates. The patterned capping dielectric layer is for keeping the logic CMOS gate electrode layer thickness controlled only by the first gate electrode layer deposition, so it is not changed by the second gate electrode layer deposition (step 104 described below) or the anisotropically etching step (step 105 described below). FIG. 2B is a cross sectional depiction of the resulting in-process IC including a split-gate flash cell following step 103 that adds a patterned capping dielectric layer 285. The patterning generally comprises using a photoresist pattern. The patterned capping dielectric layer 285 covers the flash periphery logic in the logic region 270 and the strap cells in the flash array in region 280.

Figure 2C:
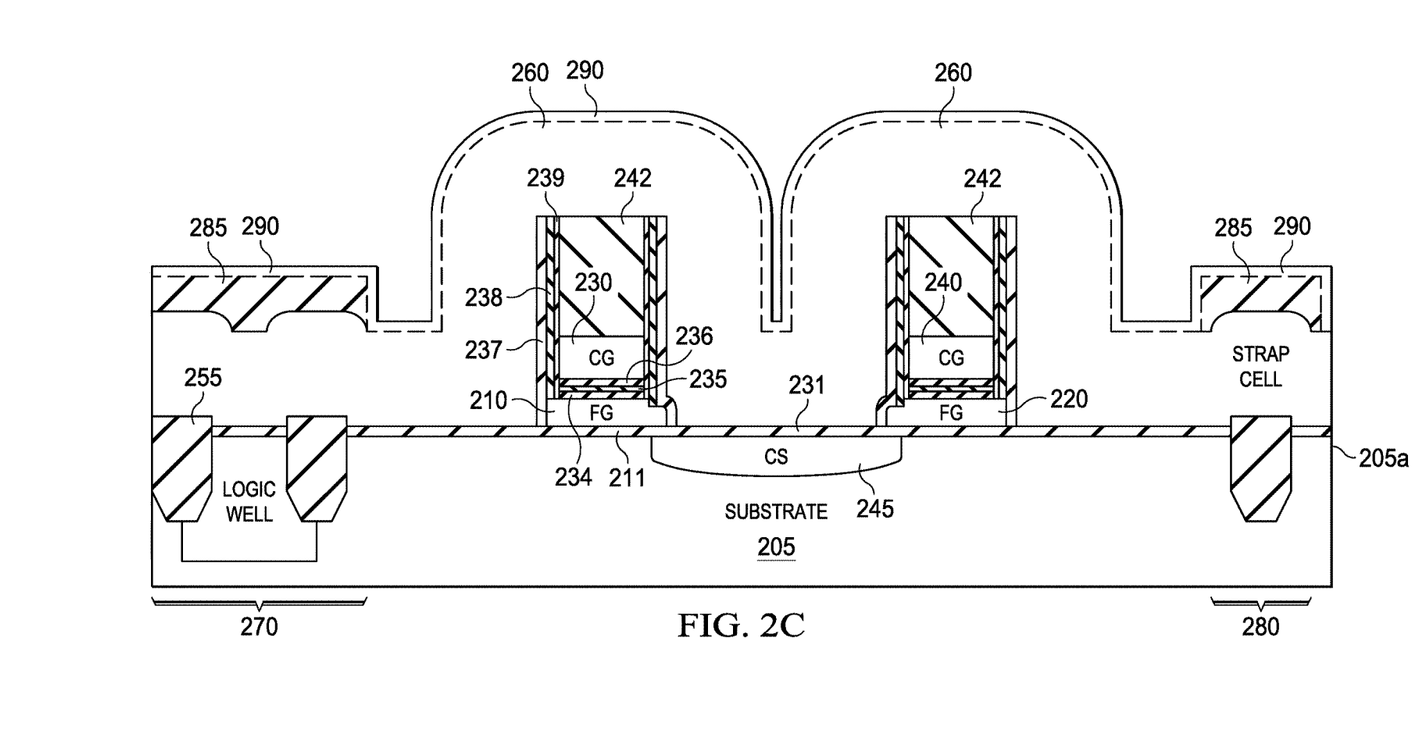

Step 104 comprises depositing a second gate electrode layer including over the first gate stack, over the second gate stack, and over the patterned dielectric layer. For example, LPCVD can be used to deposit 100 Å to about 1,000 Å of the second gate electrode layer material. The second gate electrode layer can comprise polysilicon or a metal material. FIG. 2C is a cross sectional depiction of the resulting in-process IC including a split-gate flash cell following a second gate electrode layer shown as a second polysilicon 290 which is used to adjust the polysilicon film thickness in the flash array to target the final select gate CD that is provided after step 105 (anisotropic gate electrode layer etch) described below.

It is recognized that as the deposited second polysilicon 290 film thickness (or other second gate electrode layer) increases, the width of the thick polysilicon region (or other second gate electrode layer) along the sidewalls of the gate stacks increases. As noted above the thickness range for this second polysilicon deposition generally varies from 100 Å to 1,000 Å, where a thicker second polysilicon deposition leads to larger select gate CD and a thinner deposition leads to a smaller select gate CD.

Figure 2D:
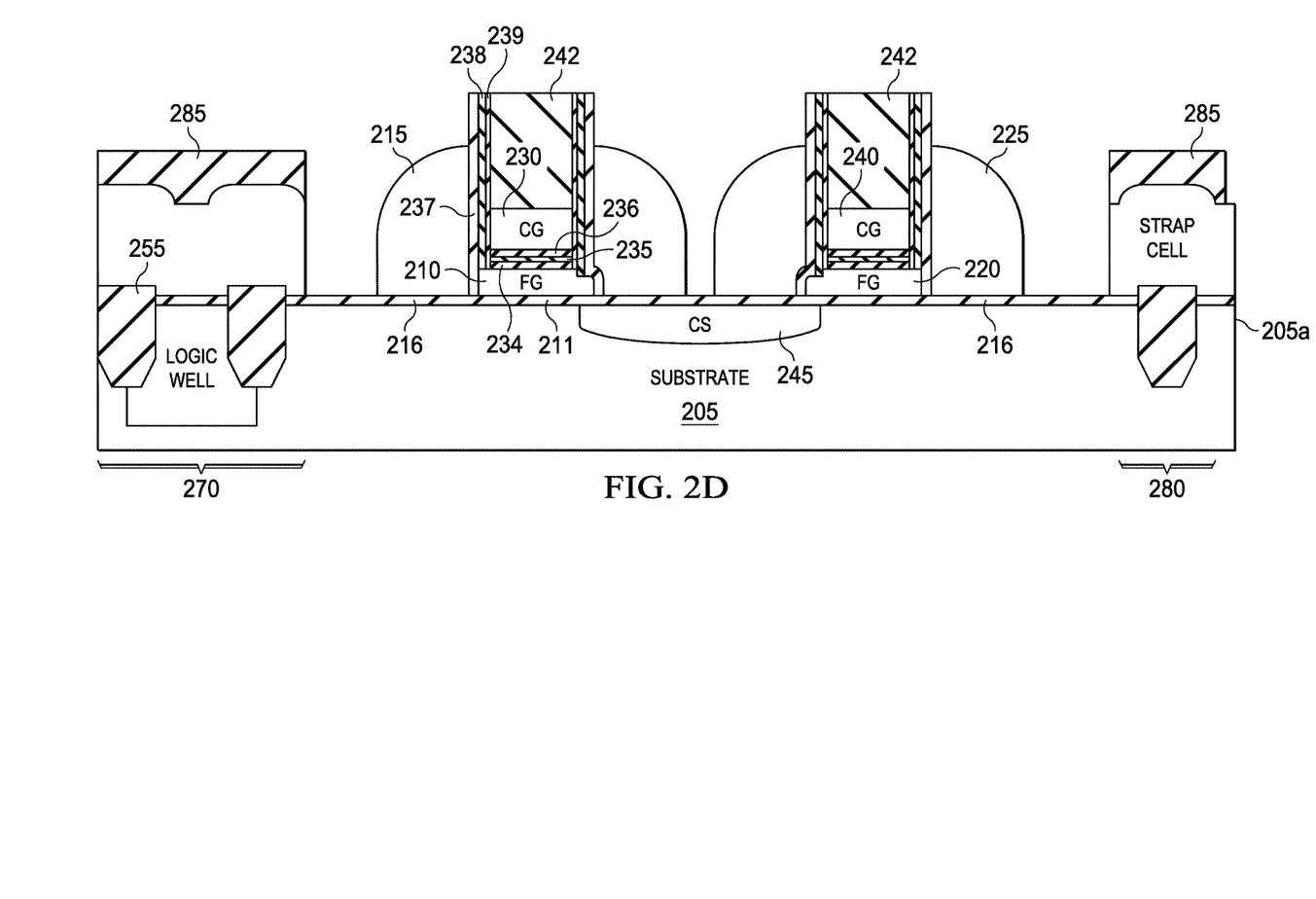

Step 105 comprises anisotropically etching including etching both the first and second gate electrode layers to form spacer-shaped select gate spacers along the sidewalls of the first gate stack to provide a first select gate on a select gate dielectric layer on the semiconductor surface and a spaced apart second select gate on the select gate dielectric layer. The select gate dielectric layer 216 can comprise a high-k dielectric layer being defined as a material with a dielectric constant κ of at least 5 compared to that of silicon dioxide being about 3.9. FIG. 2D is a cross sectional depiction of the resulting in-process IC including a split-gate flash cell following step 105 showing an even select gate 215 and an odd select gate 225 both on a select gate dielectric layer 216. The even select gate 215 and odd select gate 225 can both be seen to be spacer-shaped.

The select gate CD is defined by this spacer-like etch, such as a spacer-like polysilicon etch, where no masking layer is needed. A spacer-like etch as used herein is an anisotropic plasma etch, such as in one specific embodiment to anisotropically etch polysilicon using a mixed etch gas comprising HBr and Cl2 under conditions of chamber pressure of about 3 mT to 30 mT and RF bias power of about 40 W to 100 W. Generally using a high power and low pressure increases the energy and strength of the ion bombardment of the wafer, leading to directional etching (anisotropic) with more anisotropy.

This anisotropic plasma etch can be for removing all the second polysilicon 290 film on the flat surfaces of the die which had a relatively lower film polysilicon thickness, while keeping a portion of the polysilicon film from polysilicon layer 260 along the sidewalls of the gate stacks that as noted above had a relatively high film thickness as deposited. Thus, the spacer CD following the spacer-like etch (step 105) depends on the deposited second polysilicon 290 film thickness. Although not shown, there can be a silicide layer on the select gates 215 and 225 shown in FIG. 2D which will generally be the case when these gates comprise polysilicon.

Figure 2E:
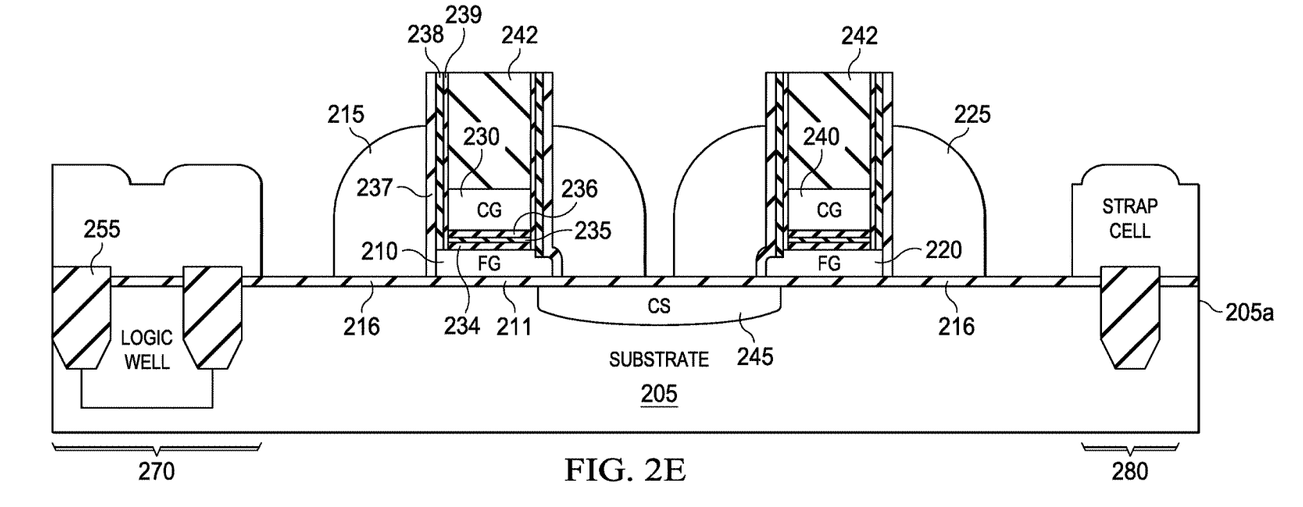

Step 106 comprises removing the patterned capping dielectric layer. FIG. 2E is a cross sectional depiction of the resulting in-process IC including a split-gate flash cell following step 106 reflecting the removal of the capping dielectric layer 285.

Figure 2F:
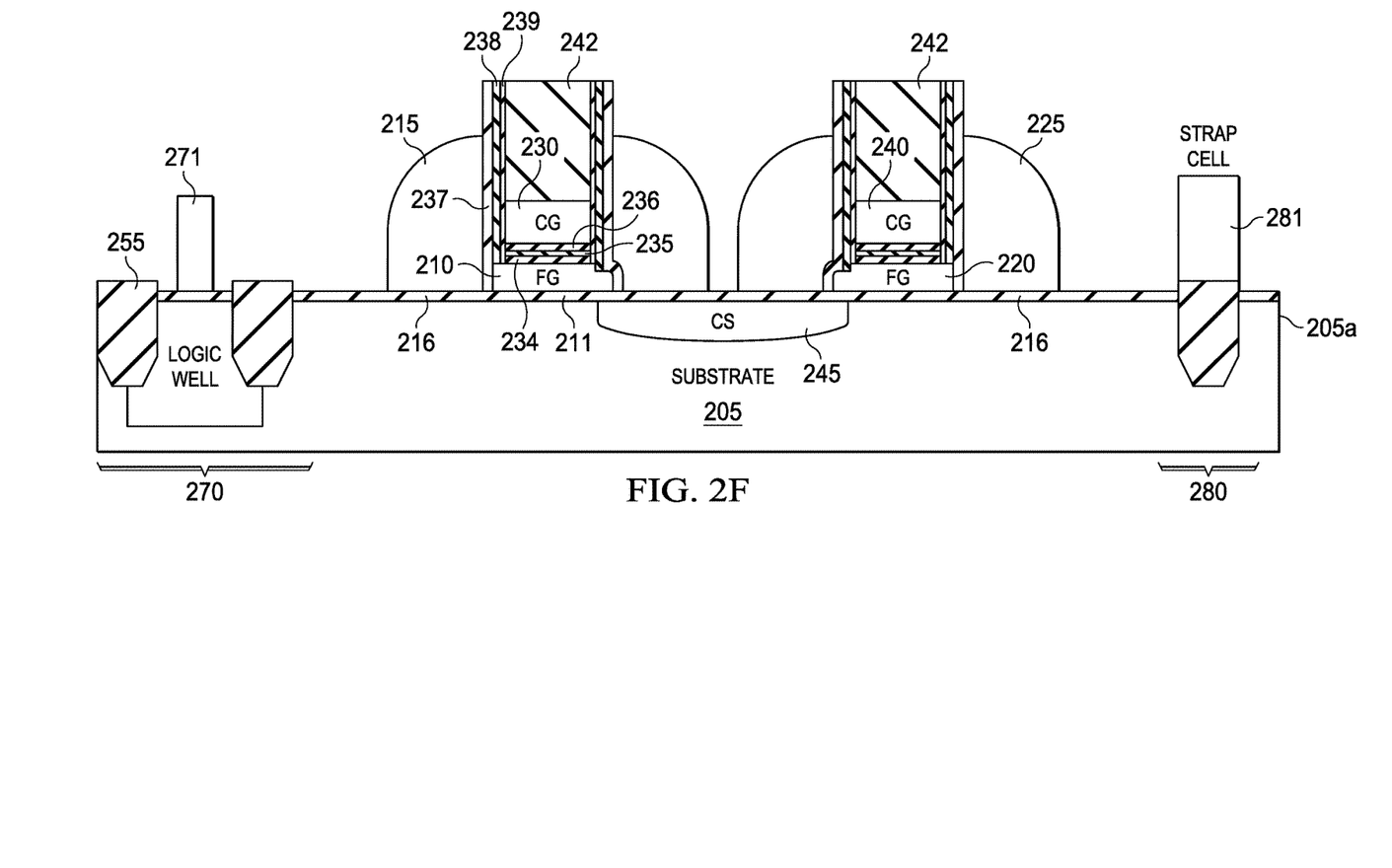

Step 107 comprises patterning logic gates and flash strap cell gates. FIG. 2F is a cross sectional depiction of the resulting in-process IC including a split-gate flash cell following step 107 showing a patterned logic gate 271 and patterned strap cell 281.

Figure 2G:
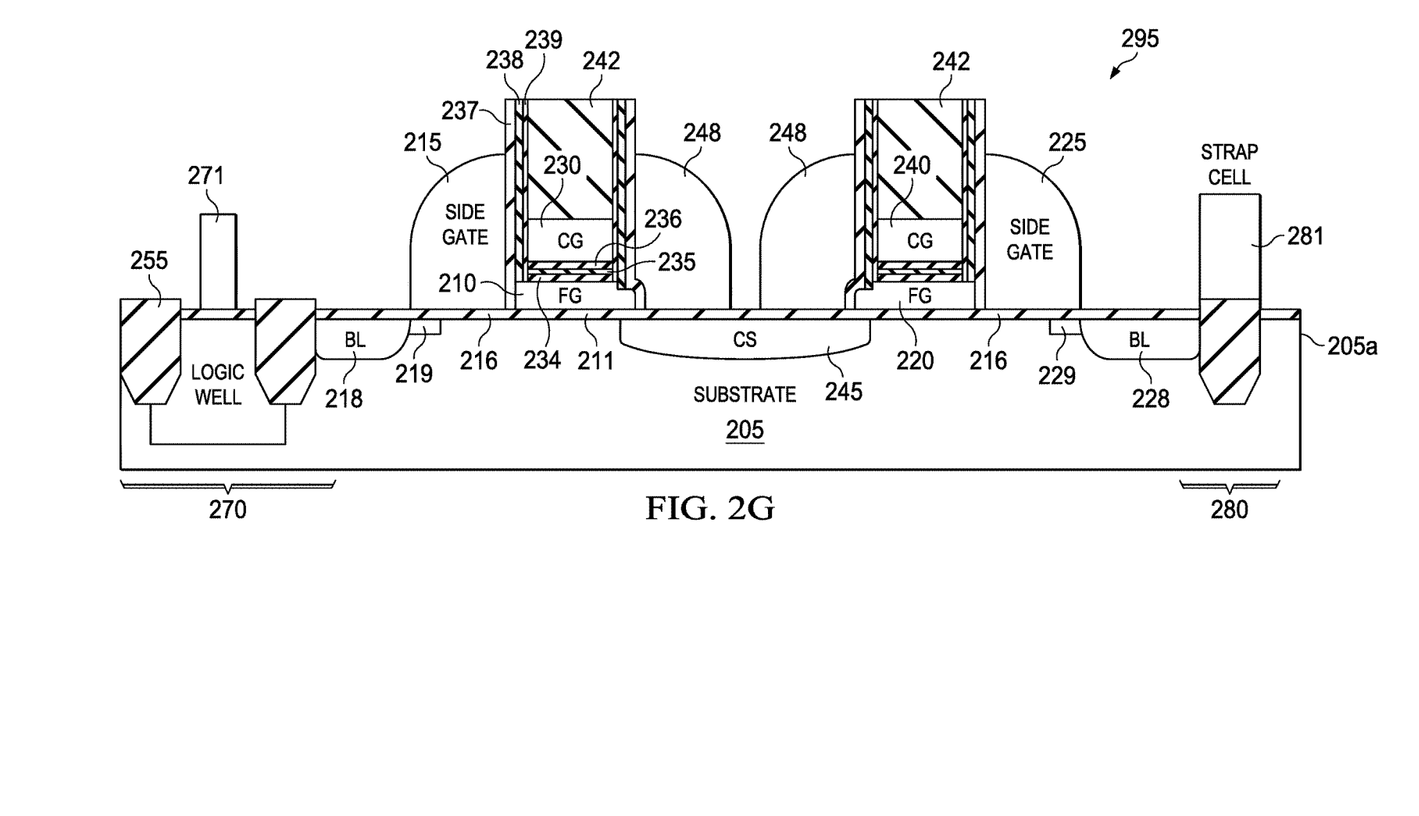

Step 108 comprises forming a first BL source/drain in the semiconductor surface 205a adjacent to the first select gate and a second BL source/drain in the semiconductor surface adjacent to the second select gate. FIG. 2G is a cross sectional depiction of an example in-process IC including a split-gate flash cell shown as 295 following step 108 that forms the BLs 218 and 228. The BLs are generally formed by ion implantation with a mask. LDDs region 219 and 229 are also shown that can be formed by an ion implant with a mask. Optionally, although not shown, a pocket implant can also be included. Contacts and the metallization stack over the split-gate flash cell 295 are not shown in FIG. 2G for simplicity. The polysilicon spacer between the gate stacks now labeled as 248 is shown extending on top of the CS 245 and can serve as a dummy gate resulting from the self-aligned gate electrode etch or as an erase gate (EG).

The disclosed select-gate patterning process in split-gate flash cells have unique feature(s). Such features include anisotropic polysilicon (or other second gate electrode layer) spacer etch that forms spacer-shaped select gates, self-alignment of the select-gates to the FG-CG stacks, the select-gate CD being adjustable to the technology target by tuning the polysilicon (or other second gate electrode layer) thickness, and no need for any adding mask compared with a conventional non-self-aligned select-gate patterning process. The CD difference between the first select-gate and the second select-gate provided is at a minimum with no conventional CD difference contribution from photo-misalignment.

Advantages of disclosed methods enabled by self-aligned select gate patterning methods include essentially eliminating the even-odd select gate CD misalignment, thus reducing the even-odd $Ir_1$ variation across the die, die-to-die, and across the wafer. Disclosed methods also do not utilize a conventional spacer hard mask for select gate electrode patterning. Disclosed methods thus do not require sacrificial layer photo patterning, and as a result there is no extra photo mask needed.

Figure 3:
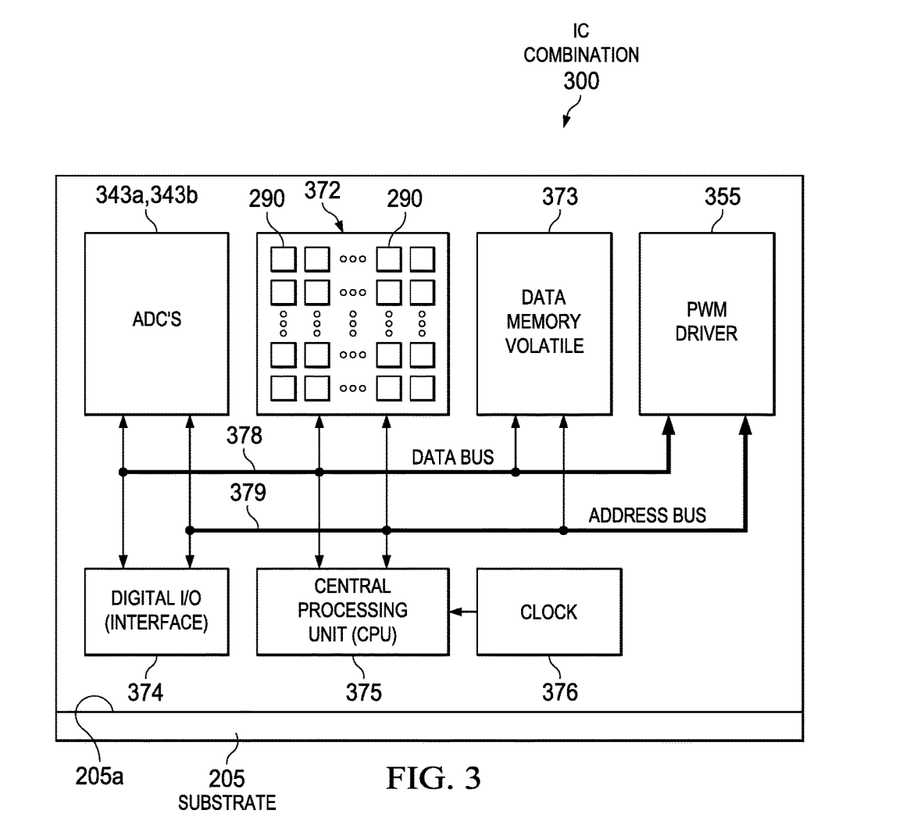
FIG. 3 is a block diagram depiction of a monolithic IC processor chip combination including a non-volatile memory comprising an array of interconnected split-gate flash cells, according to an example embodiment.

FIG. 3 is a block diagram depiction of a monolithic IC processor chip combination (IC combination) 300 formed in and on a semiconductor surface 205a of a substrate 205 including a non-volatile memory 372 comprising an array of interconnected disclosed split-gate flash cells 290, according to an example embodiment. The connection between the split-gate flash cells 290 can be in parallel to the bit lines so that each cell can be read/written/erased individually, or connected in series. On-chip flash memory is perhaps the most important memory element in any application since it is most often the source for all the instructions for the central processing unit (CPU) 375. If instructions are not fetched efficiently, the overall processor performance will likely suffer. The IC combination 300 can comprise a microprocessor, digital signal processor (DSP) or microcontroller unit (MCU).

Although not shown, the IC combination 300 generally includes other integrated circuit modules, for example, a Universal Serial Bus (USB) controller and a transceiver. IC combination 300 is shown including ADC's 343a, 343b, PWM driver 355, volatile data memory 373, digital I/O (interface) 374, and clock (or timer) 376. IC combination 300 is also shown including a digital data bus 378 and an address bus 379.

Disclosed embodiments can be used to form semiconductor die that may be integrated into a variety of assembly flows to form a variety of different devices and related products including embedded technology of split-gate flash cells integrated with CMOS logic, and also stand-alone split-gate flash cell memory. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A split-gate flash memory cell, comprising:
   a substrate having a semiconductor surface;
   a first gate stack comprising a first control gate (CG) on a first floating gate (FG) and a second gate stack comprising a second CG on a second FG, each of the first and second gate stacks being on a floating gate dielectric layer on said semiconductor surface;
   a common source/drain in said semiconductor surface between said first FG and said second FG, and
   a first select gate and a second select gate on a select gate dielectric layer between a first bitline (BL) source/drain in said semiconductor surface and said first FG and between a second BL source/drain in said semiconductor surface and said second FG, respectively;
   wherein said first select gate and said second select gate each are spacer-shaped.

2. The split-gate flash memory cell of claim 1, wherein said first select gate, said second select gate, said first CG, and said second CG each comprise polysilicon gates.

3. The split-gate flash memory cell of claim 1, wherein said first select gate, said second select gate, said first CG, and said second CG each comprise metal gates.

4. The split-gate flash memory cell of claim 1, wherein said split-gate flash memory cell is one of a plurality of split-gate flash memory cells on said semiconductor surface interconnected together and arranged in an array.

5. The split-gate flash memory cell of claim 1, comprising:
   a first dielectric layer on said first CG; and
   a second dielectric layer on said second CG.

6. The split-gate flash memory cell of claim 5, wherein said first and second dielectric layers comprise silicon nitride.

7. The split-gate flash memory cell of claim 1, comprising:
   a first dielectric stack between said first FG and said first CG; and
   a second dielectric stack between said second FG and said second CG;
   wherein each of said first and second dielectric stacks comprise at least two dielectric layers.

8. The split-gate flash memory cell of claim 1, comprising:
   a first dielectric layer and a second dielectric layer arranged along a first side wall of said first gate stack, wherein said first dielectric layer is closer to said first side wall than said second dielectric layer, and wherein a first end of said first dielectric layer contacts an upper surface of said first FG; and
   a third dielectric layer and a fourth dielectric layer arranged along a second side wall of said second gate stack, wherein said third dielectric layer is closer to said second side wall than said fourth dielectric layer, and wherein a first end of said third dielectric layer contacts an upper surface of said second FG.

9. The split-gate flash memory cell of claim 1, wherein each of said first and second FGs has a first width at a first height and a second width at a second height, said first width being greater than said second width, and said second height being greater than said first height in a direction away from said floating gate dielectric layer.

10. The split-gate flash memory cell of claim 1, wherein said common source/drain extends from said first FG to said second FG.

11. The split-gate flash memory cell of claim 1, wherein each of said first BL source/drain and said second BL source/drain connects said split-gate flash memory cell to a bitline of a memory array in which said split-gate flash memory cell is arranged.

12. An integrated circuit (IC) combination, comprising:
   a substrate having a semiconductor surface;
   a processor formed on said semiconductor surface, and
   an array of interconnected split-gate flash memory cells formed on said semiconductor surface, each said split-gate flash memory cell including:
      a first gate stack comprising a first control gate (CG) on a first floating gate (FG) and a second gate stack comprising a second CG on a second FG, each on a floating gate dielectric layer on said semiconductor surface;
      a common source/drain in said semiconductor surface between said first FG and said second FG, and
      a first select gate and a second select gate on a select gate dielectric layer between a first bitline (BL) source/drain in said semiconductor surface and said first FG and between a second BL source/drain in said semiconductor surface and said second FG, respectively;
      wherein said first select gate and said second select gate are spacer-shaped, and
   a data bus for coupling said array of interconnected split-gate flash cells to said processor.

13. The IC combination of claim 12, wherein said first select gate, said second select gate, said first CG, and said second CG each comprise polysilicon gates.

14. The IC combination of claim 12, wherein said first select gate, said second select gate, said first CG, and said second CG each comprise metal gates.

15. The IC combination of claim 12, wherein said IC combination comprises a microcontroller unit (MCU).

16. The IC combination of claim 12, wherein said split-gate flash memory cell comprises n-channel metal-oxide semiconductor (NMOS) transistors.

17. The IC combination of claim 12, comprising:
   a first dielectric layer and a second dielectric layer arranged along a first side wall of said first gate stack, wherein said first dielectric layer is closer to said first side wall than said second dielectric layer, and wherein a first end of said first dielectric layer contacts an upper surface of said first FG; and
   a third dielectric layer and a fourth dielectric layer arranged along a second side wall of said second gate stack, wherein said third dielectric layer is closer to said second side wall than said fourth dielectric layer, and wherein a first end of said third dielectric layer contacts an upper surface of said second FG.

18. The IC combination of claim 12, wherein said interconnected split-gate flash memory cells comprise a first split-gate flash memory cell, wherein said first BL source/drain of said first split-gate flash memory cell is between said first select gate and an isolation structure formed at least partially in said substrate, and wherein said second BL source/drain of said first split-gate flash memory cell is between said second select gate and a strap cell.

19. The IC combination of claim 12, wherein said common source/drain extends from said first FG to said second FG.

20. The IC combination of claim 12, comprising a plurality of bitlines, wherein said first BL source/drain and said second BL source/drain of each said split-gate memory cell is connected to one of said plurality of bitlines.

* * * * *